United States Patent [19]

Noboru

[11] Patent Number: 4,998,293
[45] Date of Patent: Mar. 5, 1991

[54] MULTIPLE-BAND MIXER CIRCUIT

[75] Inventor: Mitsuhiro Noboru, Minamikawachi, Japan

[73] Assignee: Sharp Kabushiki Kaisha, Osaka, Japan

[21] Appl. No.: 221,872

[22] Filed: Jul. 20, 1988

[30] Foreign Application Priority Data

Oct. 1, 1987 [JP] Japan ............................ 62-150999[U]

[51] Int. Cl.⁵ ........................................... H04B 17/02
[52] U.S. Cl. .................................... 455/189; 455/190; 455/209; 455/226; 455/330
[58] Field of Search ............... 455/145, 180, 188, 189, 455/190, 191, 209, 323, 325, 330, 331, 333, 3–4, 131, 226; 358/86, 84, 188

[56] References Cited

U.S. PATENT DOCUMENTS

| | | | |
|---|---|---|---|
| 3,189,836 | 6/1965 | Podell | 455/331 |
| 3,327,221 | 6/1967 | Rieth | 455/180 |
| 3,946,318 | 3/1976 | Gruber | 455/236 |
| 4,179,662 | 12/1979 | Pflasterer | 455/189 |
| 4,191,966 | 3/1980 | Ovnick, Jr. | 358/86 |
| 4,509,198 | 4/1985 | Nagatomi | 455/190 |
| 4,555,808 | 11/1985 | Fujimoto | 455/189 |
| 4,607,394 | 8/1986 | Nightengale | 455/330 |
| 4,633,188 | 12/1986 | Matsuta | 455/333 |
| 4,710,974 | 12/1987 | Kupfer | 455/330 |

FOREIGN PATENT DOCUMENTS 61-101133  5/1986  Japan .

Primary Examiner—Reinhard J. Eisenzopf
Assistant Examiner—Andrew Faile

[57] ABSTRACT

A multiple-band mixer circuit includes at least two mixer circuit blocks, a selection circuit block for selecting one of the mixer circuit blocks, and a monitor circuit provided for common use by the at least two mixer circuit blocks, for monitoring the operation state of a mixer circuit block selected by the selection circuit block.

5 Claims, 1 Drawing Sheet

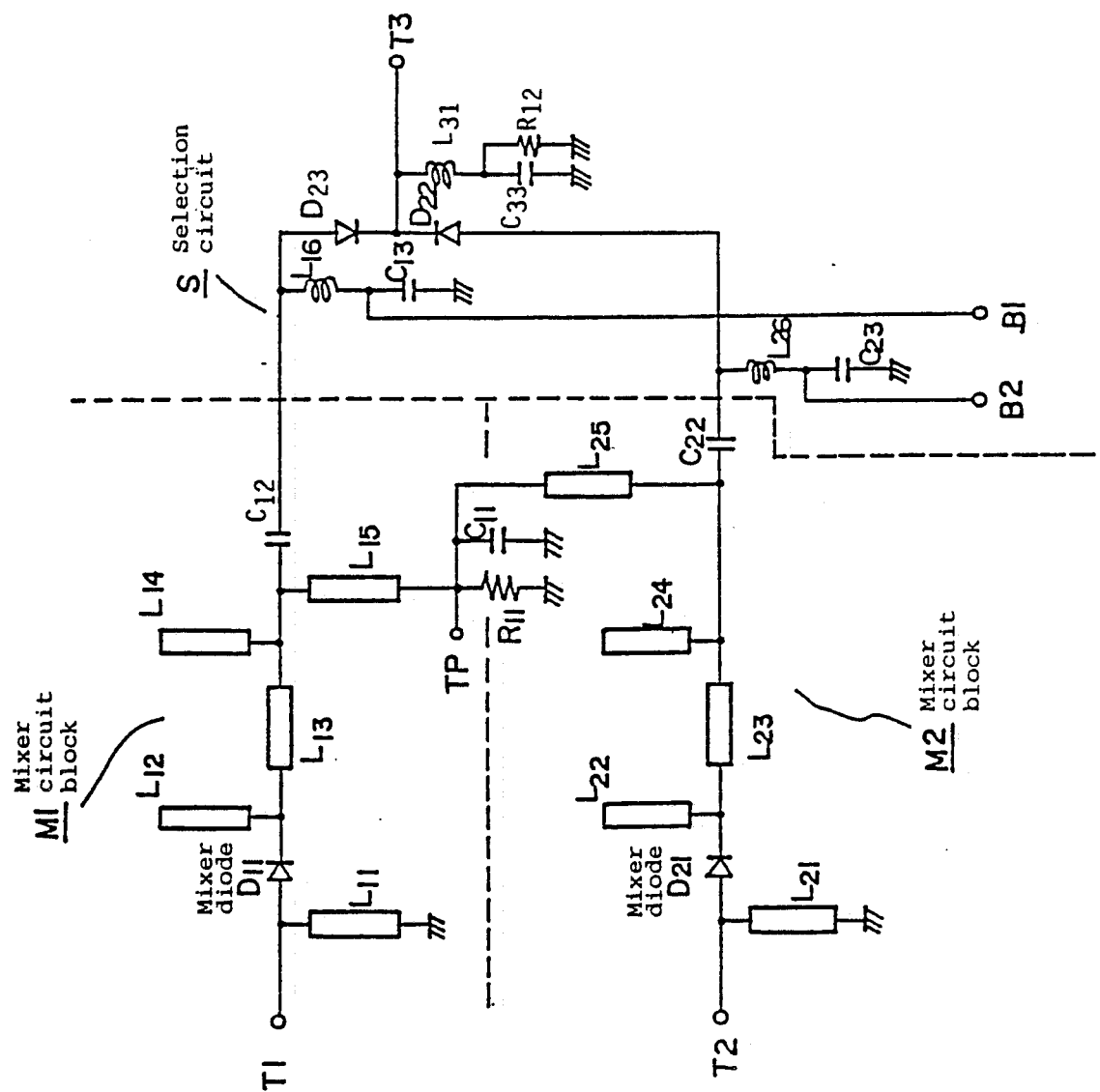
FIGURE I

MULTIPLE-BAND MIXER CIRCUIT

BACKGROUND OF THE INVENTION

This invention relates to a multiple-band mixer circuit for use in an LNB (Low Noise Blockdown Converter) in the outdoor unit of a satellite broadcast receiving station, which circuit is capable of receiving multiple bands of broadcast wave.

The conventional two-band mixer circuit contains two independent mixer circuit blocks to receive two bands, that is, the first and the second bands. To select either of the two bands, a selection circuit is connected to the two mixer circuit blocks, thereby allowing either of the mixer circuit blocks to operate. Two monitor circuits are connected separately to the two mixer circuit blocks, respectively, to check for the operation of the mixer circuit blocks. As a result, the two-band mixer circuit becomes large in size, thereby does not meeting the increasing demand in smaller components for a two-band mixer circuit-containing satellite broadcast receiving system.

SUMMARY OF THE INVENTION

In view of the above conventional problem, an object of the present invention is to provide a multiple-band mixer circuit having a monitor circuit which checks for the operating state of a plurality of mixer circuit blocks and is shared by the plurality of the mixer circuit blocks.

Other objects and further scope of applicability of the present invention will become apparent from the detailed description given below. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above object, according to an embodiment of the present invention, a multiple-band mixer circuit comprises at least two mixer circuit blocks, a selection circuit for selecting one of the mixer circuit blocks, and a monitor circuit provided for common use by the at least two mixer circuit blocks to monitor the operation state of the mixer circuit block selected by the selection circuit.

BRIEF DESCRIPTION OF THE DRAWINGS

The present invention will become more fully understood from the detailed description given below and the accompanying drawings which are given by way of illustration only, and thus are not limitative of the present invention and wherein:

FIG. 1 is a circuit diagram of the two-band mixer circuit of an embodiment of the present invention.

DETAILED DESCRIPTION OF THE EMBODIMENT

The two-band mixer circuit of an embodiment of the invention is described with reference to the attached drawings. It should be noted that the present invention is not limited to a mixer circuit for two bands, the invention being applicable to more than two-band mixer circuits.

Referring to the figure, the two-band mixer circuit comprises a mixer circuit block M1 for a first band, a mixer circuit block M2 for a second band and a selection circuit block S for selecting the mixer circuit block M1 or M2. When the circuit has received a signal, the received signal and a local signal are supplied to the appropriate mixer circuit block M1 or M2. Specifically, when the first band has been received, the first band signal and a local signal are inputted to the terminal T1 of the band mixer circuit block M1 and converted to an IF signal by a mixer diode $D_{11}$. The IF signal from the band mixer circuit block M1 is selected by the selection circuit block S and outputted to a terminal T3. When the second band has been received, the second band signal and a local signal are inputted to the terminal T2 of the band mixer circuit block M2 and converted to an IF signal by a mixer diode $D_{21}$. The IF signal from the band mixer circuit block, M2 is then selected by the selection circuit block S and outputted to the terminal T3.

An appropriate band mixer circuit block M1 or M2 is selected by the line voltage supplied from a local oscillator selectively to either the terminal B1 or B2 of the selection circuit block S. The local oscillator supplies power only to the mixer circuit block appropriate for a received band, so that the mixer circuit block appropriate for the received band alone is operated. Voltage is applied selectively to either the terminal B1 or B2 of the selection circuit block S thereby connecting only the necessary mixer circuit block alone, with the selection circuit block S and preventing the influence by the mixer circuit block which is not operated. In the two-band mixer circuit of the present invention, a circuit comprising a resistor $R_{11}$ and a capacitor $C_{11}$ monitors the diode current of the band mixer circuit block M1 or M2. It is possible to check the mixer circuit block M1 or M2 for normal operation by measuring the voltage at the terminal TP of the monitor circuit.

According to the present invention, since the local oscillator supplies power only to the mixer circuit block appropriate for the band received, the two mixer circuit blocks will never operate simultaneously.

According to the present invention, only one parallel circuit comprising the resistor $R_{11}$ and the capacitor $C_{11}$ is connected as a monitor circuit to the two band mixer circuit blocks M1 and M2. The diode current for each band is led through a reactance $L_{15}$ or $L_{25}$ to the parallel circuit. Therefore, diode current of either mixer circuit block can be measured at one monitor terminal TP.

In the two-band mixer circuit of the present invention, the diode current of the mixer circuit block M1 or M2 flows through the reactance $L_{15}$ or $L_{25}$ to the resistor $R_{11}$. When a local signal is supplied to the terminal T2 of the mixer circuit block M2, for instance, the diode current flows through $L_{21}$, $D_{21}$, $L_{23}$, $L_{25}$ and $R_{11}$. At this time, the monitor circuit is linked via the reactance $L_{15}$ with the other mixer circuit block M1, but the circuit is not influenced by the mixer circuit block M1 as direct current is blocked by a coupling capacitor $C_{12}$ and the reverse direction characteristic of the mixer diode $D_{11}$. The similar function works when the mixer circuit block M1 receives a band. Accordingly, it is possible to check that each band mixer circuit block operates normally in receiving the band.

In the figure, $L_{11}$ through $L_{16}$, $L_{21}$ through $L_{26}$ and $L_{31}$ are reactance, $D_{11}$ and $D_{21}$ are mixer diodes, $R_{11}$ and $R_{12}$ are resistors, $C_{11}$, $C_{13}$, $C_{23}$ and $C_{33}$ are capacitors, and $D_{23}$ and $D_{22}$ are diodes.

According to the present invention, as mentioned above, the multiple-band mixer circuit contains a monitor circuit for common use by each band mixer circuit block, making it possible to check each band mixer circuit block for normal operation. Since one monitor circuit is shared by multiple mixer circuit blocks, the circuit can be made small in size.

Thus, this invention provides a small, effective multiple-band mixer circuit which shares a parallel circuit of a resistor and a capacitor for monitoring diode current for each band, the parallel circuit monitoring each band accurately.

While only certain embodiments of the present invention have been described, it will be apparent to those skilled in the art that various changes and modifications may be made therein without departing from the spirit and scope of the present invention as claimed.

What is claimed is:

1. A multiple-band mixer circuit comprising:
   at least two mixer circuit blocks, each having a mixer diode for converting a frequency of a received signal;
   selection circuit block means, operatively connected to said mixer circuit blocks, for selecting one of said mixer circuit blocks; and
   a single monitor circuit, commonly connected to said mixer circuit blocks, for monitoring a diode current through said mixer diode of said mixer circuit block selected by said selection circuit to check an operational state of the selected mixer circuit block;
   said single monitor circuit including a single parallel circuit of a resistor and a capacitor commonly connected to said mixer circuit blocks via a reactance.

2. The multiple-band mixer circuit as claimed in claim 1, further comprising:
   oscillator means, operatively connected to said selection circuit, for supplying power only to said mixer circuit block selected by said selection circuit, thereby only allowing the selected mixer circuit block to operate.

3. A two-band mixer circuit comprising:
   two mixer circuit blocks, each having a mixer diode for converting a frequency of a received signal;
   selection circuit block means, operatively connected to said two mixer circuit blocks, for selectively one of said two mixer circuit blocks appropriate for a band of the received signal; and
   a single monitor circuit commonly connected to said two mixer circuit blocks;
   said single monitor circuit monitoring a diode current through said mixer diode in the selected mixer circuit block to check the operation of the selected mixer circuit block;
   said monitor circuit including a single parallel circuit made up of a resistor and a capacitor commonly connected to said two mixer circuit blocks.

4. A two-band mixer circuit as claimed in claim 3, wherein each mixer circuit block has a reactance, respectively, and wherein said parallel circuit is connected to said two mixer circuit blocks through said respective reactance.

5. A two-band mixer circuit as claimed in claim 3, wherein said selection circuit block comprises a local oscillator for supplying power only to one of said two mixer circuit blocks so that only one mixer circuit block operates at a time.

* * * * *